United States Patent

Choi et al.

[11] Patent Number: 5,912,043
[45] Date of Patent: Jun. 15, 1999

[54] WAFER SPIN COATING SYSTEM WITH PHOTORESIST PUMPING UNIT CHECK FUNCTION

[75] Inventors: Sun-jip Choi, Hwasung-gun; Jong-kwan Kim; Ill-jin Jang, both of Suwon, all of Rep. of Korea

[73] Assignee: Samsung Electronics Co, Ltd., Suwon, Rep. of Korea

[21] Appl. No.: 08/966,383

[22] Filed: Nov. 7, 1997

[30] Foreign Application Priority Data

Nov. 18, 1996 [KR] Rep. of Korea ........................ 96 55033

[51] Int. Cl.⁶ ........................................................ B05D 3/12
[52] U.S. Cl. .......................... 427/8; 427/240; 427/385.5; 437/231; 118/52; 118/688; 118/692
[58] Field of Search ................................ 427/240, 385.5, 427/8; 437/231; 118/52, 665, 692

[56] References Cited

U.S. PATENT DOCUMENTS 5,766,671  6/1998  Matsui .......................................... 427/8

*Primary Examiner*—Janyce Bell
*Attorney, Agent, or Firm*—Jones, Volentine, Steinberg & Whitt, L.L.P.

[57] ABSTRACT

A wafer spin coating system, for coating a layer of photoresist on a wafer, includes a spin coating unit, a pumping unit and a sensing unit. A first controller in the spin coating unit controls the operation of a rotating device with the wafer mounted thereon. The first controller also outputs a photoresist pumping operation order. A second controller in the pumping unit receives the pumping operation order and outputs a pumping operation commencing signal and a valve operation signal that opens and closes a valve to control a gas feeding operation. The sensing unit receives the pumping operation commencing signal and the valve operation signal, and selectively outputs an abnormal status control signal to the first controller to stop the pumping operations if an abnormality is detected.

13 Claims, 3 Drawing Sheets

WAFER SPIN COATING SYSTEM WITH PHOTORESIST PUMPING UNIT CHECK FUNCTION

BACKGROUND OF THE INVENTION

1. Field of the Invention

The present invention relates to a wafer spin coating system and, more particularly, to a spin coating system in which photoresist pumping operations are continually checked, and the spin coating operation is stopped when abnormal pumping operations are detected to thereby prevent the production of inferior quality wafers.

2. Discussion of the Related Art

It is known that when fabricating a semiconductor device, a wafer must repeatedly pass through various chemical and mechanical processing steps, e.g., oxidation, diffusion, ion implantation, photolithography, metallization and test processes.

During the semiconductor fabrication process, a photoresist coating step is performed prior to forming a mask pattern on the wafer. The photoresist includes a photosensitive resin, the main component of which is usually polyvinyl-silicon for semiconductor fabrication.

After a thin film of the photoresist is coated on the wafer, usually by spin coating, the wafer is exposed to light and developed. Either the exposed portion of photoresist is removed (in the case of positive resist), or the unexposed portion is removed (in the case of negative resist), to thereby form a desired photoresist pattern. Thereafter, photolithography or ion implantation is done using the mask pattern as shaped through the above process.

The particular thickness of the thin photoresist film coated on the wafer by the spin coating method is dependent on, for example, the viscosity coefficient and polymeric content of the photoresist, and the spinning speed and acceleration of the spin coater. When the spinning operation is complete, 80%–90% of the solvent contained in the photoresist is evaporated so that the thin film coated on the wafer is nearly in a dried state. After the thin film is completely dried, the wafer is subjected to additional processing steps.

A conventional system for spin coating the photoresist on the wafer is illustrated in FIG. 1. The conventional spin coating system can be generally divided into two parts, namely, a pumping unit 10 for pumping the photoresist from a tank or container and a spin coating unit 12 that receives and spin coats the photoresist on the wafer.

The pumping unit 10 is provided with an internal container 14 that is connected to a plurality of containers 16, 18 outside the pumping unit that are filled with the photoresist. The photoresist is fed into the internal container 14 of the pumping unit 10 from the external containers 16, 18 through valves 20, 22, respectively. This photoresist feeding operation is performed by reducing the pressure in the internal container 14 by discharging the air contained therein through a discharge valve 24.

The photoresist contained in the internal container 14 is fed to the spin coating unit 12 through a valve 26. The pumping force necessary for transferring the photoresist from the internal container 14 to the spin coating unit 12 is generated by pressurizing the internal container 14 with nitrogen gas ($N_2$). The nitrogen gas is introduced into the internal container 14 through an open valve 28, while the other valves 20, 22 and 24 are closed. The increase in pressure due to the nitrogen causes the photoresist to be discharged to the spin coating unit 12 through the valve 26 and thereafter sprayed onto the wafer in the spin coating unit 12.

A controller 30 controls the opening and closing of the valves 20, 22, 24, 26 and 28 to feed the photoresist and the nitrogen gas to the internal container 14 in the pumping unit 10.

In the spin coating unit 12, the spin coating operation is performed by mounting a wafer on a rotation driving device 34 and rotating the rotation drive device 34 while the photoresist is sprayed onto the rotating wafer.

In operation, the controller 32 in the spin coating unit 12 receives a spin coating commencement signal, starts rotating the wafer, then outputs a pumping operation order to the controller 30 of the pumping unit 10. The controller 30 then closes valves 20, 22 and 24 while opening valves 26 and 28. The nitrogen gas is introduced into the internal container 14 to increase the pressure on the photoresist contained therein. The pressurized photoresist is then fed to the spin coating unit 12 through valve 26 and sprayed onto the wafer.

However, in the conventional spin coating systems, the wafer coating operation is performed and the pumping operation orders are sent to the pumping unit 10 without checking whether or not the photoresist is being sprayed on the wafer. As a result, even when the photoresist pumping operation is not performing normally, due to a system error for example, and the photoresist is not being sprayed onto the wafer, the controller 32 for the spin coater keeps rotating the wafer. This causes the condition of the wafer to deteriorate. Also, when the deteriorated wafer passes through the wafer coating operation without the photoresist being sprayed thereon, subsequent processing steps are negatively affected. As such, a large number of substandard wafers may be produced before the condition is identified and corrected.

SUMMARY OF THE INVENTION

Accordingly, the present invention is directed to a wafer spin coating system having a photoresist pumping operation check f unction which substantially overcomes one or more of the problems due to the limitations and disadvantages of the related art.

An object of the present invention is to provide a wafer spin coating system having a photoresist pumping operation check function for preventing wafer deterioration by stopping the spin coating operation upon detecting an abnormal photoresist pumping operation.

To achieve these and other advantages and in accordance with the purposes of the present invention, there is provided a wafer spin coating system for coating a layer of photoresist on a wafer, comprising: a spin coating unit comprising a rotating device having the wafer mounted thereon, and a first controller which controls the operation of the rotating device and which outputs a photoresist pumping operation order; a pumping unit comprising an internal tank containing photoresist connected to at least one external photoresist supply tank and to the spin coating unit, a second controller which outputs a pumping operation commencing signal on receipt of the pumping operation order, and outputs a valve operation signal that opens and closes a valve to control a gas feeding operation, wherein a gas applied to the internal tank increases a pressure therein and thereby discharges the photoresist to the spin coating unit; and a sensing unit having inputs for receiving the pumping operation commencing signal and the valve operation signal, and an output responsive to the input signals for selectively sending an abnormal status control signal to the first controller.

The first controller stops the rotating device and sends a pumping stop order to the second controller when the abnormal status control signal is received.

The sensing unit comprises a first switching unit that is switched on and off in response to the pumping operation commencing signal, a second switching unit that is switched on and off in response to the valve operation signal, and a third switching that is switched on and off in response to the first and second switching units.

The first switching unit is switched on upon receipt of the pumping operation commencing signal in a logic high state and switched off upon receipt of the pumping operation commencing signal in a logic low state, and the second switching unit is switched on upon receipt of the valve operation signal in a logic high state and switched off upon receipt of the valve operation signal in a logic low state. The third switching unit is switched on when one of the pumping operation commencing signal and the valve operation control signal are in the logic low state, wherein the abnormal status control signal is then sent to the first controller. The third switching unit is switched off when both the pumping operation commencing signal and the valve operation control signal are in the logic high state.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings illustrate an embodiment of the invention. For simplicity, the lines connecting the various units in FIG. 1 and FIG. 2 represent pipes or other equivalent transfer means for the photoresist. The signal lines in FIGS. 1, 2 and 3 are also represented by single lines for simplicity. In the drawings.

DETAILED DESCRIPTION OF PREFERRED EMBODIMENT

Reference will now be made in to the preferred embodiment of the present invention, an example of which is illustrated in the accompanying drawings.

Figure 1:
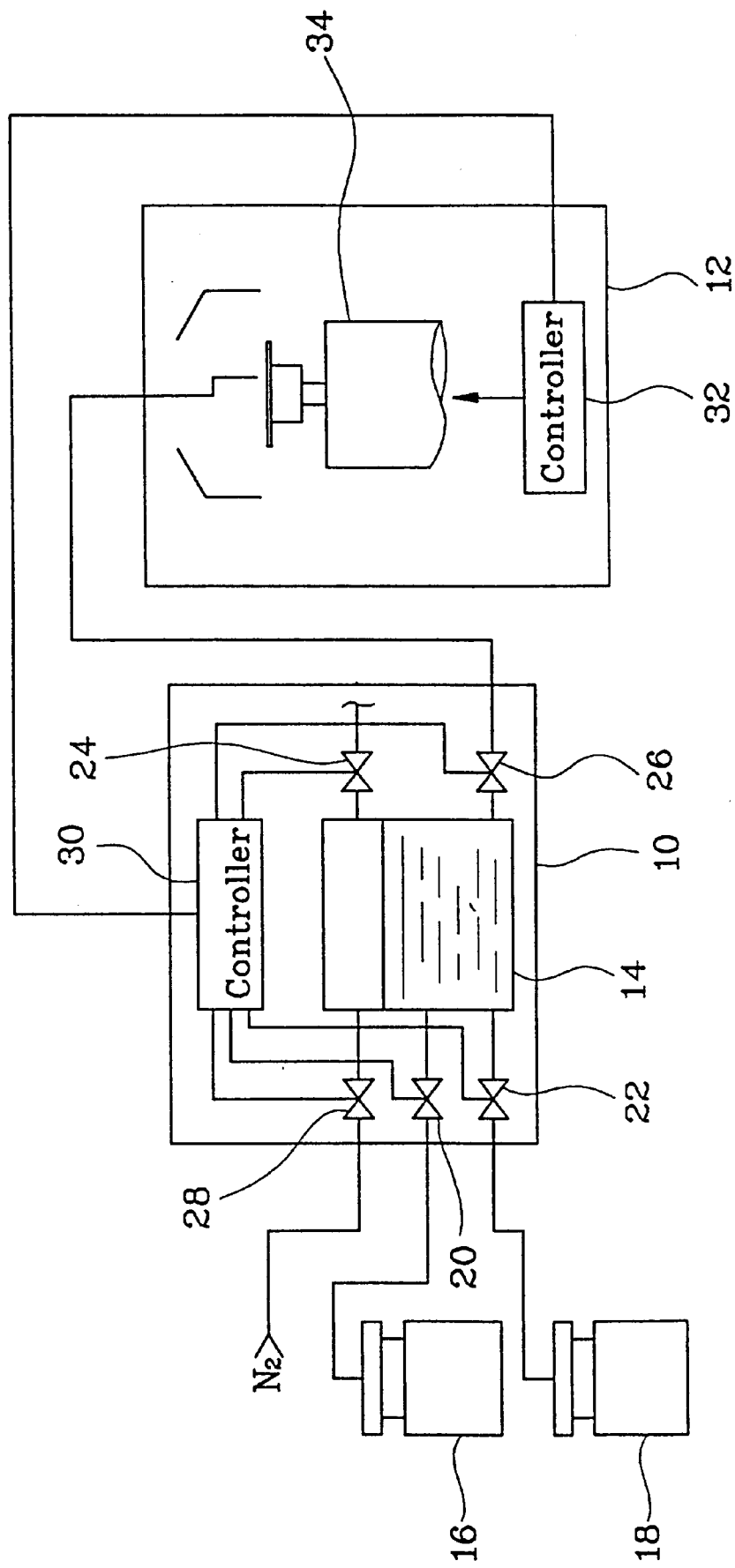
FIG. 1 is a block diagram of a conventional wafer spin coating system.
Figure 2:
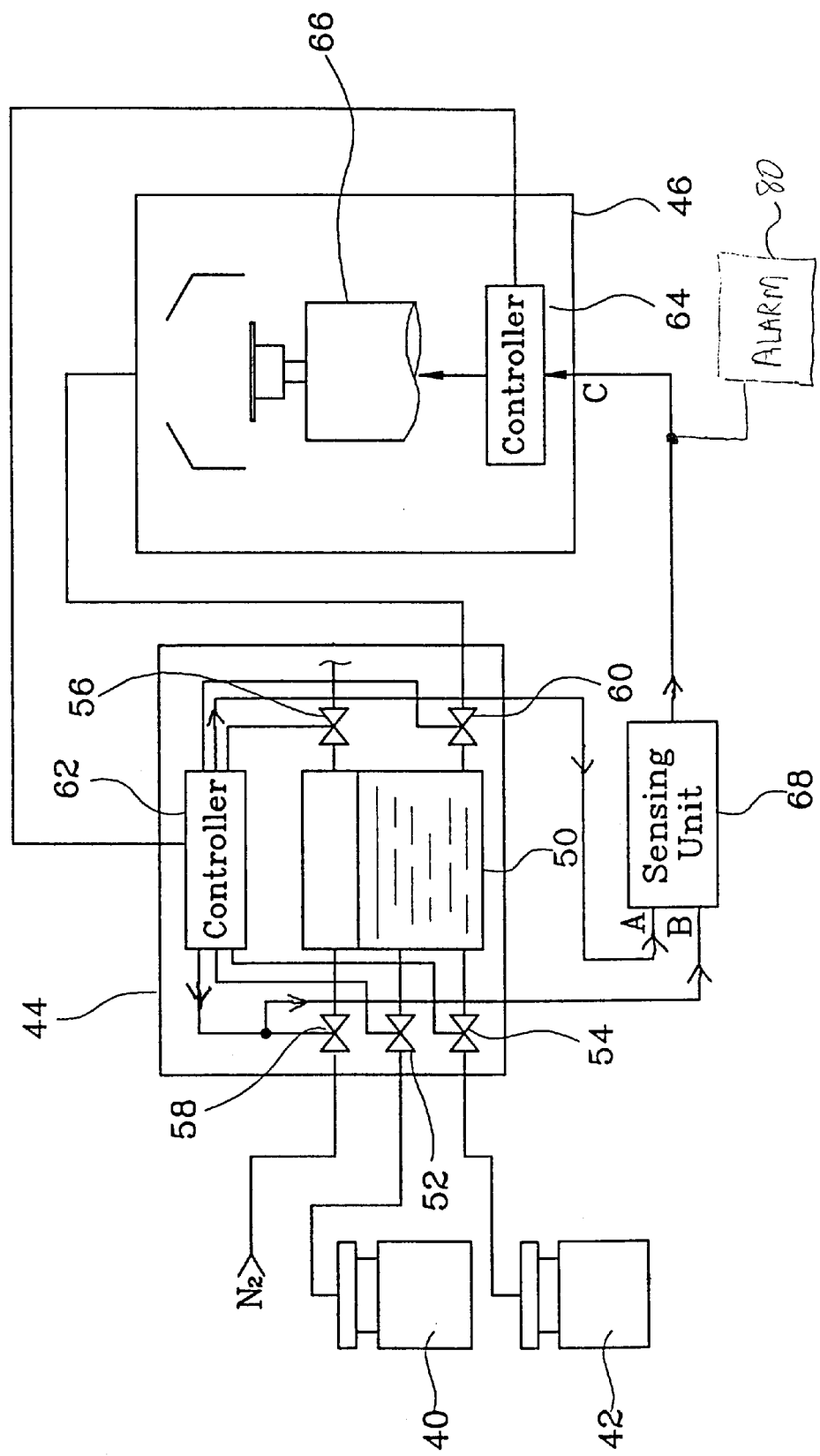
FIG. 2 is a block diagram of a wafer spin coating system having a photoresist pumping operation check function according to a preferred embodiment of the present invention.

As illustrated in FIG. 2, the wafer spin coating system according to the present invention generally includes a pumping unit 44, a spin coating unit 46 and a sensing unit 68.

The pumping unit 44 and the spin coating unit 46 operate in a similar fashion to the conventional pumping unit 10 and spin coating unit 12 described previously. Specifically, the pumping unit 44 is provided with an internal container 50 that is connected to a plurality of containers 40, 42 outside the pumping unit that are filled with the photoresist. The photoresist is fed from the external containers 40, 42 into the internal container 50 through valves 52 and 54. This photoresist feeding operation is performed by reducing the pressure in the internal container 50 by discharging the air contained therein through a discharge valve 56.

The photoresist contained in the internal container 50 is fed to the spin coating unit 46 through a valve 60. The pumping force necessary for transferring the photoresist from the internal container 50 to the spin coating unit 46 is generated by pressurizing the internal container 50 with nitrogen gas ($N_2$). The nitrogen gas is introduced into the internal container 50 through an open valve 58, while the other valves 52, 54 and 56 are closed. The increase in pressure due to the nitrogen causes the photoresist to be discharged to the spin coating unit 46 through the valve 60 and thereafter sprayed onto the wafer.

A controller 62 in the pumping unit 44 controls the opening and closing of the valves 52, 54, 56, 58 and 60 to feed the photoresist and the nitrogen gas into the internal container 50 in the pumping unit 44.

In the spin coating unit 46, the spin coating operation is performed by mounting a wafer on a rotation driving device 66 and rotating the rotation drive device 66 while the photoresist is sprayed onto the rotating wafer.

In operation, the controller 64 in the spin coating unit 46 receives a spin coating commencement signal, starts rotating the wafer, then outputs a pumping operation order to the controller 62 of the pumping unit 44. The controller 62 then closes valves 52, 54 and 56 while opening valves 58 and 60. The nitrogen gas is introduced into the internal container 50 to increase the pressure on the photoresist contained therein. The pressurized photoresist is then fed to the spin coating unit 46 through valve 60 and sprayed onto the wafer.

The present invention includes an additional sensing unit 68. In response to the pumping operation order from controller 64, the controller 62 of the pumping unit 44 simultaneously transmits a valve opening and closing signal (valve operation signal) B to the valve 58 and to an input of the sensing unit 68. A pumping operation commencing signal A, which starts the pumping operation, is also sent to another input of the sensing unit 68. The sensing unit 68 logically sums the received signals A and B, and then, based on the logical sum, selectively transmits an abnormal status control signal C to the controller 64. When generated by the sensing unit 68, the abnormal status control signal indicates that the pumping operations are not being performed correctly.

Figure 3:
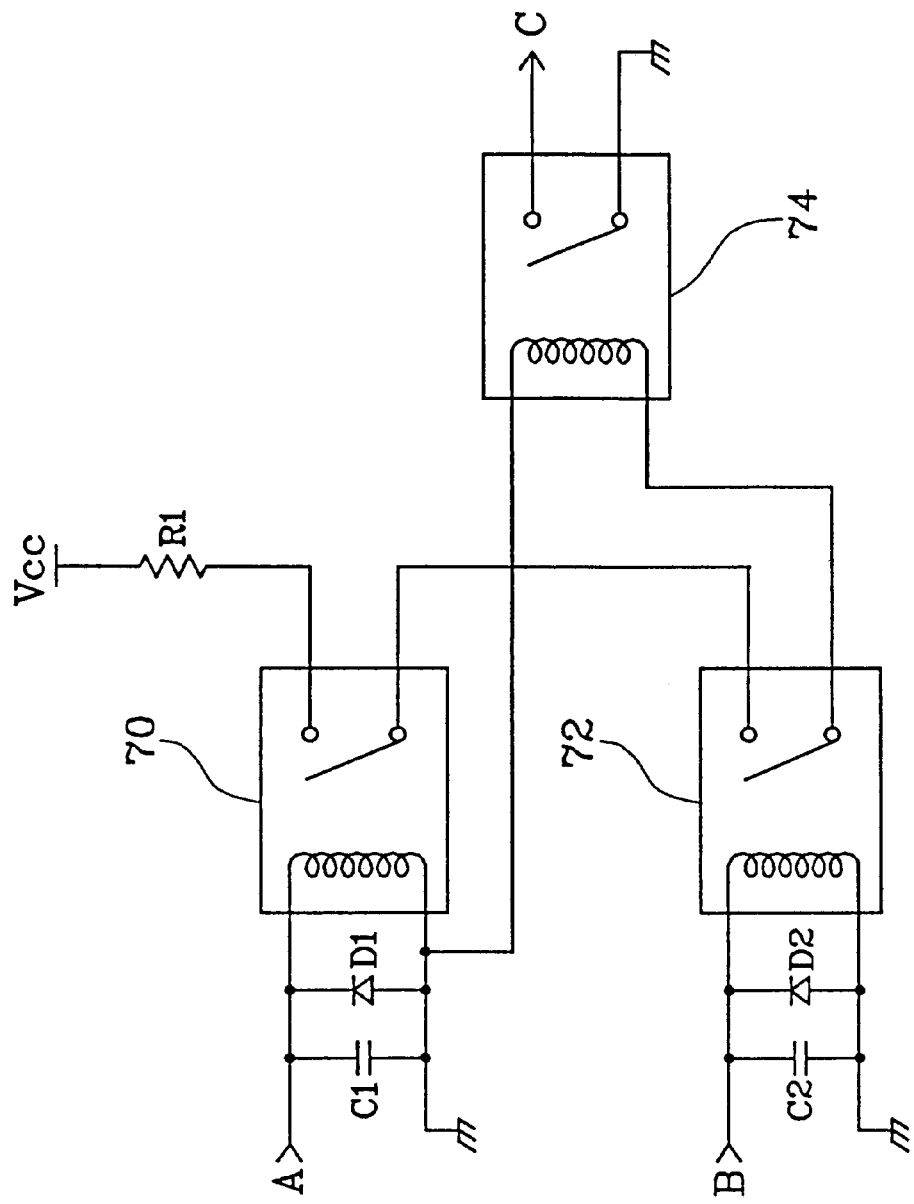
FIG. 3 is a circuit diagram of a sensing unit for the embodiment of FIG. 2.

The sensing unit 68 is now described in greater detail with reference to FIG. 3. The sensing unit 68 comprises a first relay 70 which receives the pumping operation commencing signal A, a second relay 72 which receives the valve operation signal B, and a third relay 74 which receives the signals from the relays 70 and 72 to thereby selectively output the abnormal status control signal C. Smoothing capacitors C1 and C2 and reverse current preventing diodes D1 and D2 are disposed on the input side of the relays 70 and 72 in a parallel relationship. When the relays 70 and 72 are turned on, a voltage Vcc for driving the relay 74 is applied through a resistance R1.

The operation of the spin coating system for coating a thin photoresist film on a wafer of the present invention will now be described. First, a wafer is placed on the rotation driving device 66. Then the worker operates the controller 64, which rotates the rotation driving device 66 and sends a pumping operation order to the controller 62 of the pumping unit 44.

When the pumping operation order is received by the controller 62 of the pumping unit 44, the controller 62 outputs valve operation signal B to open the valves 56 and 60. When the valve 58 opens, the nitrogen gas is introduced into the container 50, which increases the pressure on the photoresist contained therein. The photoresist is then fed through valve 60 to the spin coating unit 46 and sprayed onto the wafer.

At the same time, the controller 62 sends the valve operation signal B and the pumping operation commencing signal A to the sensing unit 68. The pumping operation signal A is a logic signal having high and low states, which is output from the controller 62 on receipt of the pumping operation order from the controller 64 in the spin coating unit 46.

The relays 70 and 72 in the sensing unit 68 are turned on when the logic high signal is applied to their input ends, and the relay 74 is turned on when a logic low signal is applied to its input end.

When the pumping operations are normal, the pumping operation commencing signal A and the valve operation signal B are applied to the sensing unit 68 in a high-state. Thus, the relays 70 and 72 are turned on while the relay 74 is turned off. Therefore, the abnormal status control signal C is not generated.

On the other hand, if an abnormality occurs in the pumping operation, such as when the valve 58 does not open after the pumping operation order has been sent to the controller 62, wafer deterioration can result. In this case the valve operation signal B is applied to the sensing unit 68 at a logic low state, while the pumping operation commencing signal A is applied to the sensing unit 68 at a logic high state. Accordingly, the relay 70 (signal A) of the sensing unit 68 is turned on and the relay 72 (signal B) is turned off. This causes a logic low signal to be applied to the input of the relay 74, which turns relay 74 on. The sensing unit 68 thus sends the abnormal status control signal C to the controller 64, which in turn stops the spin coating operation and sends a pumping stop order to the controller 62 to thereby stop the photoresist pumping operation.

Therefore, when an abnormal photoresist pumping operation is detected, the sensing unit 68 prevents the continued operation of the pumping unit 44 and the spin coating unit 46, thereby stopping the production of inferior wafers. An audio and/or visual alarm 80 can be connected to the sensing unit 68 to notify the operator of an abnormality, with the alarm 80 being energized when the abnormal status control signal C is sent from the sensing unit 68 to the first controller 64.

It will be apparent to those skilled in the art that various modifications and variations can be made in the wafer spin coating system of the present invention without departing from the spirit or scope of the invention. Thus, it is intended that the present invention cover the modifications and variations of this invention provided they come within the scope of the appended claims and their equivalents.

What is claimed is:

1. A wafer spin coating system for coating a layer of photoresist on a wafer, comprising:
   a spin coating unit comprising
      a rotating device having the wafer mounted thereon, and
      a first controller which controls the rotating device and which outputs a photoresist pumping operation order;
   a pumping unit comprising
      an internal tank containing photoresist connected to at least one external photoresist supply tank and to the spin coating unit,
      a second controller which outputs a pumping operation commencing signal on receipt of the pumping operation order, and outputs a valve operation signal that opens and closes a valve to control a gas feeding operation, wherein a gas applied to the internal tank increases a pressure therein and thereby discharges the photoresist to the spin coating unit; and
   a sensing unit having inputs for receiving the pumping operation commencing signal and the valve operation signal, and an output responsive to the input signals for selectively sending an abnormal status control signal to the first controller.

2. The wafer spin coating system as claimed in claim 1, wherein the first controller stops the rotating device and sends a pumping stop order to the second controller when the abnormal status control signal is received.

3. The wafer spin coating system as claimed in claim 2, the sensing unit comprising:
   a first switching unit that is switched on and off in response to the pumping operation commencing signal;
   a second switching unit that is switched on and off in response to the valve operation signal; and
   a third switching that is switched on and off in response to the first and second switching units.

4. The wafer spin coating system as claimed in claim 3, wherein the first switching unit is switched on upon receipt of the pumping operation commencing signal in a logic high state and switched off upon receipt of the pumping operation commencing signal in a logic low state, and the second switching unit is switched on upon receipt of the valve operation signal in a logic high state and switched off upon receipt of the valve operation signal in a logic low state.

5. The wafer spin coating system as claimed in claim 4, wherein the third switching unit is switched on when one of the pumping operation commencing signal and the valve operation control signal are in the logic low state, wherein the abnormal status control signal is then sent to the first controller.

6. The wafer spin coating system as claimed in claim 5, further comprising an alarm connected to the sensing unit which is energized when the abnormal status control signal is sent from the sensing unit to the first controller.

7. The wafer spin coating system as claimed in claim 5, each of the first and second switching units comprising a capacitor, a reverse current preventing diode and a relay disposed parallel therein.

8. The wafer spin coating system as claimed in claim 4, wherein the third switching unit is switched off when both the pumping operation commencing signal and the valve operation control signal are in the logic high state.

9. The wafer spin coating system as claimed in claim 7, wherein the third switching unit is a relay.

10. A method of monitoring a photoresist pumping operation in a wafer spin coating system for coating a layer of photoresist on a wafer, comprising the steps of:
    generating a photoresist pumping operation order by a first controller in a spin coating unit and sending the pumping operation order to a second controller in a pumping unit;
    generating, by the second controller, a pumping operation commencing signal, on receipt of the pumping operation order, and generating a valve operation signal that opens and closes a valve to control a gas feeding operation;
    applying the gas to an internal tank containing photoresist in the pumping unit to discharge the photoresist to the spin coating unit; and receiving, by a sensing unit, the pumping operation commencing signal and the valve operation signal, and selectively generating an abnormal status control signal to the first controller.

11. The method of monitoring as claimed in claim 10, further comprising a step of sending a pumping stop order from the first controller to the second controller when the abnormal status control signal is received.

12. The method of monitoring as claimed in claim 10, wherein during the receiving step, the abnormal status control signal is generated and sent to the first controller when the sensing unit receives one of the pumping operation commencing signal and the valve operation control signal in a logic low state.

13. The method of monitoring as claimed in claim 10, wherein during the receiving step, the abnormal status control signal is not generated when the sensing unit receives both the pumping operation commencing signal and the valve operation control signal in a logic high state.

* * * * *